United States Patent [19] [11] 4,421,988
Robertson et al. [45] Dec. 20, 1983

[54] BEAM SCANNING METHOD AND APPARATUS FOR ION IMPLANTATION

[75] Inventors: David A. Robertson, West Newbury; Norman L. Turner, Gloucester, both of Mass.

[73] Assignee: Varian Associates, Inc., Palo Alto, Calif.

[21] Appl. No.: 349,742

[22] Filed: Feb. 18, 1982

[51] Int. Cl.³ .......................... G21K 5/00; H01J 3/28
[52] U.S. Cl. .................................. 250/492.2; 250/398
[58] Field of Search ............................ 250/492.2, 398

[56] References Cited

U.S. PATENT DOCUMENTS 4,260,893  4/1981  Bakker et al. ...................... 250/397
4,260,897  4/1981  Bakker et al. ...................... 250/492 A
4,283,631  8/1981  Turner ............................ 250/492 B

OTHER PUBLICATIONS

Pending application Serial No. 349,293 filed 2/16/82, Berkowitz.

Primary Examiner—Alfred E. Smith
Assistant Examiner—J. Berman
Attorney, Agent, or Firm—Stanley Z. Cole; William R. McClellan

[57] ABSTRACT

Method of and apparatus for scanning a charged particle beam over a semiconductor wafer in a prescribed pattern. A triangular waveform, including alternating positive and negative ramp portions of constant slope and controllable time durations, is applied to a horizontal deflection system and produces horizontal scanning of the beam. The time durations of the ramp portions determine the length of the horizontal scan lines and are controlled according to a predetermined sequence so as to provide the prescribed pattern. The triangular waveform is provided by an integrator which receives a square wave from a frequency source of controllable frequency. The predetermined sequence is stored in a read only memory which controls the frequency of the frequency source. At the completion of each ramp portion, a voltage applied to a vertical deflection system is incremented so as to step the beam vertically up or down.

19 Claims, 5 Drawing Figures

BEAM SCANNING METHOD AND APPARATUS FOR ION IMPLANTATION

BACKGROUND OF THE INVENTION

This invention relates to charged particle beam scanning of a workpiece and, more particularly, to a method of and apparatus for highly efficient, highly uniform ion beam scanning of a workpiece, such as a semicondutor wafer.

Ion implantation has become a standard technique for introducing impurities into semiconductor wafers in a controlled and rapid manner. A beam of ions is generated in a source and directed with varying degrees of acceleration toward the semiconductor wafer. The impurities are introduced into the bulk of semiconductor wafers by using the momentum of the ions as a means of embedding them in the crystalline lattice of the semiconductor material. Uniformity of impurity concentration over the surface of the semiconductor wafer is of utmost importance in semiconductor processing. In addition, one of the major objectives in commercial semiconductor processing is to achieve a high throughput in terms of wafers processed per unit time.

One way to achieve high throughput is to simultaneously process a number of wafers in a batch. Such systems typically involve mechanical movement of wafers in relation to a beam which is scanned in one dimension. Batch processing systems, however, are generally large to accommodate the batches and are generally used only for high dose implantations. In addition, throughput is less than optimum because of the time required to manually change batches. Furthermore, if the processing system experiences a problem, large numbers of expensive semiconductor wafers can be destroyed.

Another approach has been to process wafers one at a time and to employ automatic wafer handling to improve throughput. The wafer is typically held stationary and the ion beam is electrostatically scanned in a two dimensional pattern over its surface. Such a pattern is disclosed in U.S. Pat. No. 4,283,631 issued Aug. 11, 1981 to Turner. Constant amplitude scanning signals are applied to x and y deflection plates to deflect the ion beam in a square Lissajous pattern. The scanning signals are scaled in amplitude to insure that the square pattern covers the round semiconductor wafer. (Wafers typically have one flat edge, but for present purposes this can be ignored.) In addition, the dimension of the square pattern is made slightly larger than the diameter of the wafer to provide a certain amount of overscan. Overscan is necessary to avoid nonuniformities in the doping of the wafer when the beam reverses direction after each scan line and to allow for variations in wafer diameter and position. Furthermore, as the cross-sectional dimension of the ion beam increases, the amount of overscan must be increased to insure that the beam is entirely off the wafer before it is reversed. It can be seen that time spent by the system in scanning the corners of the square pattern outside the periphery of the wafer is unproductive in terms of ion implantation and reduces system throughput. In typical prior art systems, the time spent by the system in scanning portions of the pattern outside the periphery of the semiconductor wafer has been as much as 30% of the total scanning time.

An arrangement for reducing wasted scanning time and confining the scan pattern to the general shape of a circle is disclosed in U.S. Pat. No. 4,260,897, issued Apr. 7, 1981 to Bakker et al. Semicircular conductive elements placed on opposite sides of the wafer detect the ion beam when it scans off the wafer and cause reversal of the scan direction. However, such an arrangement adds complexity to the system. Furthermore, the detector elements are subject to degradation by the ion beam and must be changed to correspond to the size of the semiconductor wafer being processed.

It is a general object of the present invention to provide a new and improved method of and apparatus for scanning a charged particle beam over a workpiece.

It is another object of the present invention to provide a method of and apparatus for scanning a charged particle beam over a workpiece in a highly efficient pattern.

It is yet another object of the present invention to provide a method of and apparatus for scanning a charged particle beam over a workpiece in a highly uniform pattern.

It is still another object of the present invention to provide a method of and apparatus for scanning a charged particle beam over a workpiece in a pattern which enhances the speed with which workpieces are processed.

It is a further object of the present invention to provide a method of and apparatus for scanning a charged particle beam over a workpiece in a pattern corresponding in shape to the shape of the workpiece.

It is a further object of the present invention to provide a method of and apparatus for scanning a charged particle beam over a workpiece in a pattern which is selectable in size to correspond to the size of the workpiece.

SUMMARY OF THE INVENTION

According to the present invention, these and other objects and advantages are achieved in apparatus for scanning a charged particle beam over a workpiece. The apparatus comprises first deflection means for deflection of the beam in response to a first scanning voltage and means coupled thereto for generating the first scanning voltage. The first scanning voltage includes alternating positive ramp portions and negative ramp portions and transitions therebetween. The positive and negative ramp portions are controllable in time duration. The apparatus further comprises second deflection means for deflection of the beam in response to a second scanning voltage and means coupled thereto for generating the second scanning voltage. The first and the second deflection means are operative to deflect the beam in mutually perpendicular directions. The second scanning voltage remains constant during the positive and negative ramp portions and is incremented at the time of the transitions between ramp portions. The apparatus still further includes means for controlling the time durations of the positive and negative ramp portions according to a series of predetermined time durations so as to provide a scan pattern corresponding in size and shape to the size and shape of the workpiece.

According to another aspect of the present invention, there is provided a method for scanning a charged particle beam over a workpiece in a charged particle beam irradiation system of the type including first deflection means and second deflection means operative to deflect the beam in mutually perpendicular directions in response to voltages applied thereto. The method comprises the steps of generating a first scanning voltage which includes alternating positive ramp portions and negative ramp portions and transitions therebetween and applying the first scanning voltage to the first deflection means. The positive and negative ramp portions are controllable in time duration. The method further comprises the steps of generating a second scanning voltage, which remains constant during the positive and negative ramp portions and which is incremented at each of the transitions between ramp pportions, and applying the second scanning voltage to the second deflection means. The method still further comprises the step of controlling the durations of the positive and negative ramp portions according to a predetermined sequence so as to provide a scan pattern corresponding in size and shape to the size and shape of the workpiece.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

Figure 1:
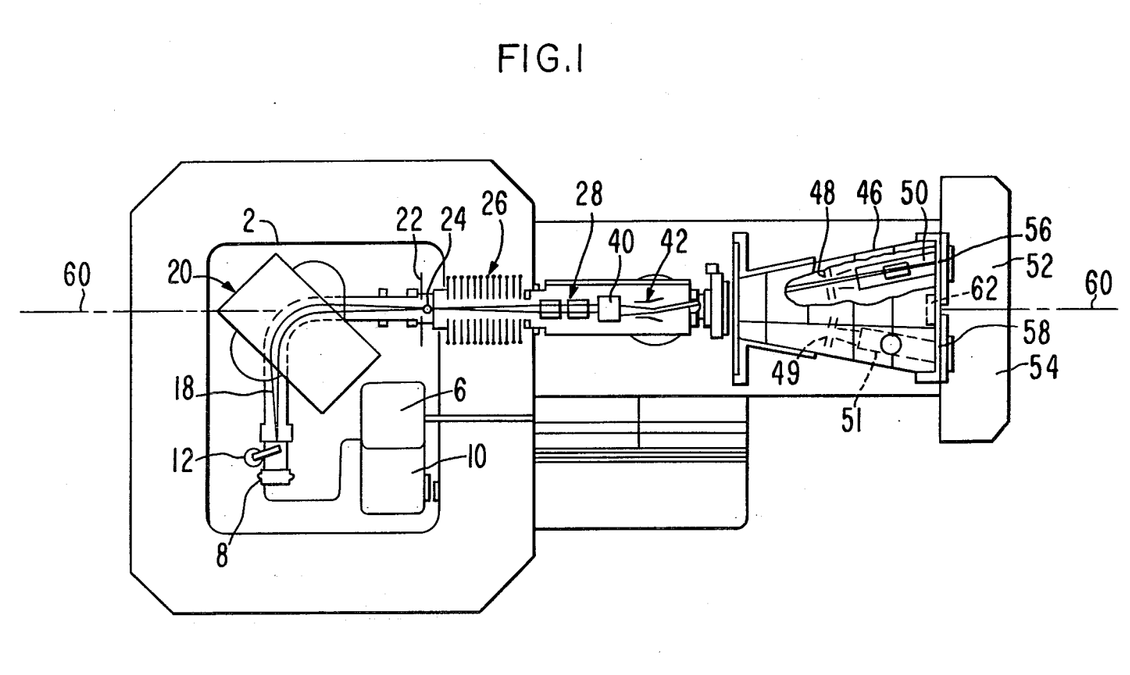
FIG.1 is a schematic diagram of an ion implantation system.

The charged particle beam scanning method and apparatus according to the present invention is typically used in an ion implantation system. An example of an ion implantation system is illustrated in FIG. 1. A high voltage terminal 2 is held at high potential relative to ground by a high voltage power sypply (not shown). The terminal 2 houses the apparatus required to form a beam of ions of desired species. In common practice a gaseous feedstock of the desired species is employed. A source gas produced from a gas handling system 6 is directed to an ion source 8. A typical ion source 8 requires a power supply 10 to sustain an ionizing discharge, a source magnet 12 to impose an axial magnetic field across the discharge region and an extraction electrode (not shown) to shape the electric field at the aperture of the source 8 for effective removal of a well-defined high current ion beam 18. Ion source techniques are generally known in the art. The ion beam 18 diverging from the ion source 8 is mass momentum analyzed and focused by an analyzer magnet 20, which is energized from an analyzer power supply (not shown). The analyzed beam passes through a resolving aperture 22 and a variable slit 24 and then through an acceleration tube 26 where it encounters a carefully designed field gradient from the high voltage terminal 2 to ground potential. Optical elements, such as a quadrupole lens 28, operate to produce a spatial-energy focus at a desired image plane. Y-scan plates 40 and x-scan plates 42 provide electrostatic deflection which directs the beam 18 over the area of the image plane. The waveforms applied to the respective deflection plates and their synchronization to form the desired scanning pattern are provided by a scanning system which is described in detail hereinafter.

A dual target chamber 46 includes a housing, beam defining masks 48, 49, and Faraday cages 50, 51 for beam monitoring. Automatic wafer handling systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. The target positions 56, 58 are typically displaced horizontally on opposite sides of the longitudinal axis 60 of the undeflected beam 18 such as to require a beam deflection of about $+7°$ from the longitudinal axis for scanning of the target positions 56, 58. A beam dump 62 is located on the longitudinal axis 60 in the target chamber 46 and intercepts the neutral portion of the ion beam 18 when the beam 18 is directed to one of the traget positions 56, 58. When neither of the target positions 56, 58 is being scanned, the charged particle beam is directed to the beam dump 62.

While vacuum pumping apparatus and the vacuum envelope are not shown, it is to be understood that the entire region traversed by the beam is maintained at high vacuum.

Figures 2, 3:
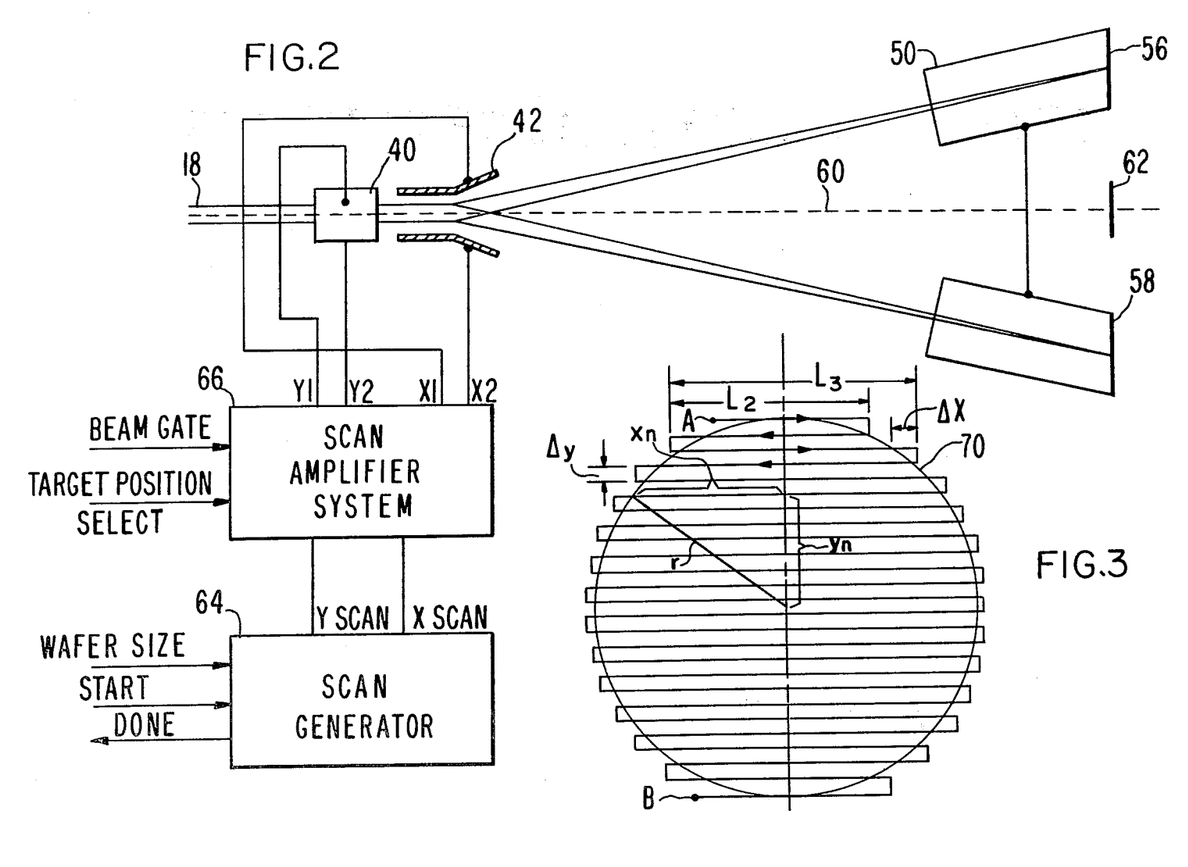
FIG. 2 is a schematic diagram of a beam scanning system in accordance with the present invention.
FIG. 3 illustrates a scanning pattern produced by the scanning system of the present invention.

The beam scanning apparatus of the present invention is illustrated in FIG. 2. The ion beam 18 is scanned over the target positions 56, 58 by application of appropriate voltages to the y-scan plates 40 and the x-scan plates 42. While the ion beam 18 is shown in FIG. 2 to be irradiating both target positions 56, 58, it is to be understood that at any instant of time the ion beam 18 is directed to only one of the target positions 56, 58. Low voltage scan signals Y SCAN, X SCAN, which determine the scan pattern, are generated by a scan generator 64, as described hereinafter, and coupled to a scan amplifier system 66. The scan signal Y SCAN is converted by the scan amplifier system 66 to vertical deflection voltages Y1, Y2 of equal magnitude and opposite polarity which are coupled to the y-scan plates 40 and deflect the beam 18 vertically. The scan signal X SCAN is converted by the scan amplifier system 66 to horizontal deflection voltages X1, X2 of equal magnitude and opposite polarity which are coupled to the x-scan plates 42 and deflect the beam 18 horizontally. The ion beam 18 is deflected to the target position 56 or 58 by adding a positive or negative dc voltage to the horizontal deflection voltages X1, X2 in response to a TARGET POSITION SELECT signal. The ion beam 18 is directed to the beam dump 62 in response to a BEAM GATE signal in which case no offset voltage is added to the horizontal deflection voltages X1, X2. Techniques for constructing scan amplifier systems are generally known in the art.

An example of a beam scanning pattern provided by the method and apparatus of the present invention is shown in FIG. 3. A semiconductor wafer 70 to be scanned is represented as a circle having a redius r. Starting at a point A at the top of the wafer 70, the ion beam is scanned horizontally to the right across the wafer 70. After the beam passes the right edge of the wafer 70, it is stepped down by a vertical step distance $\Delta y$ and scanned horizontally to the left across the wafer 70. The beam is again stepped down by the distance $\Delta y$ and scanned horizontally to the right. The process is repeated until the beam 18 reaches a point B and the wafer 70 has been completely scanned. The scanning pattern is characterized as follows. The horizontal scanning to the left and right is preferably performed at a constant rate in both directions to insure uniform impurity dosage. Alternatively, the scan rate can be varied to compensate for variations in the angle of incidence of the beam upon the target, as described in U. S. Pat. No. 4,283,631.

A horizontal scan line n has a length $L_n$. The lengths $L_n$ of the horizontal scan lines vary to correspond to the horizontal dimension of the wafer 70 at the vertical level being scanned. The length $L_n$ is slightly larger than the horizontal dimension of the wafer 70 to insure that beam reversal occurs outside ther perimeter of the wafer 70. The half-width $x_n$ of the wafer 70 at horizontal scan line n can be expressed as $$x_n = [r^2 - y_n^2]^{\frac{1}{2}} \quad (1)$$

where $Y_n$ = vertical position of horizontal scan line n. (see FIG. 3.) The length $L_n$ can be expressed as $$L_n = 2x_n + 2\Delta x \quad (2)$$

where $\Delta x$ = amount of overscan, and $$L_n = 2[r^2 - y_n^2]^{\frac{1}{2}} + 2\Delta x \quad (3)$$

Thus, for a wafer 70 of given diameter and diameter and a given overscan $\Delta x$, the length $L_n$ of each horizontal scan line can be determined. If desired, the overscan $\Delta x$ can be variable but should be minimized. A typical horizontal scanning rate is about one kilohertz. It is preferred that the vertical step distance $\Delta y$ after each horizontal scan line remain the same throughout the pattern in order to insure uniform spacing of scan lines and uniform impurity dosage over the surface of the waver 70. The vertical step distance $\Delta y$ is typically equal to the cross-sectional radius of the ion beam. Thus, the beam scans a pattern having a generally circular shape and having a high degree of uniformity.

It will be understood that the pattern shown in FIG. 3 can be scanned from bottom to top as well as from top to bottom. Also, the pattern can be rotated by ninety degrees and scanned using vertical scan lines. Furthermore, it is frequently desirable to repeat the scan pattern several times to achieve a given dosage and greater uniformity. When the pattern is repeated, a pattern is scanned in one direction (such as from top to bottom) and then is reversed and the pattern is scanned in the opposite direction (bottom to top). Each successive scan pattern can be offset vertically from the previous pattern by a distance $\delta = (\Delta y/p)$ where p is the number of times the pattern is scanned. This interlacing of successive patterns insures that the impurity dosage is highly uniform.

Figure 4:
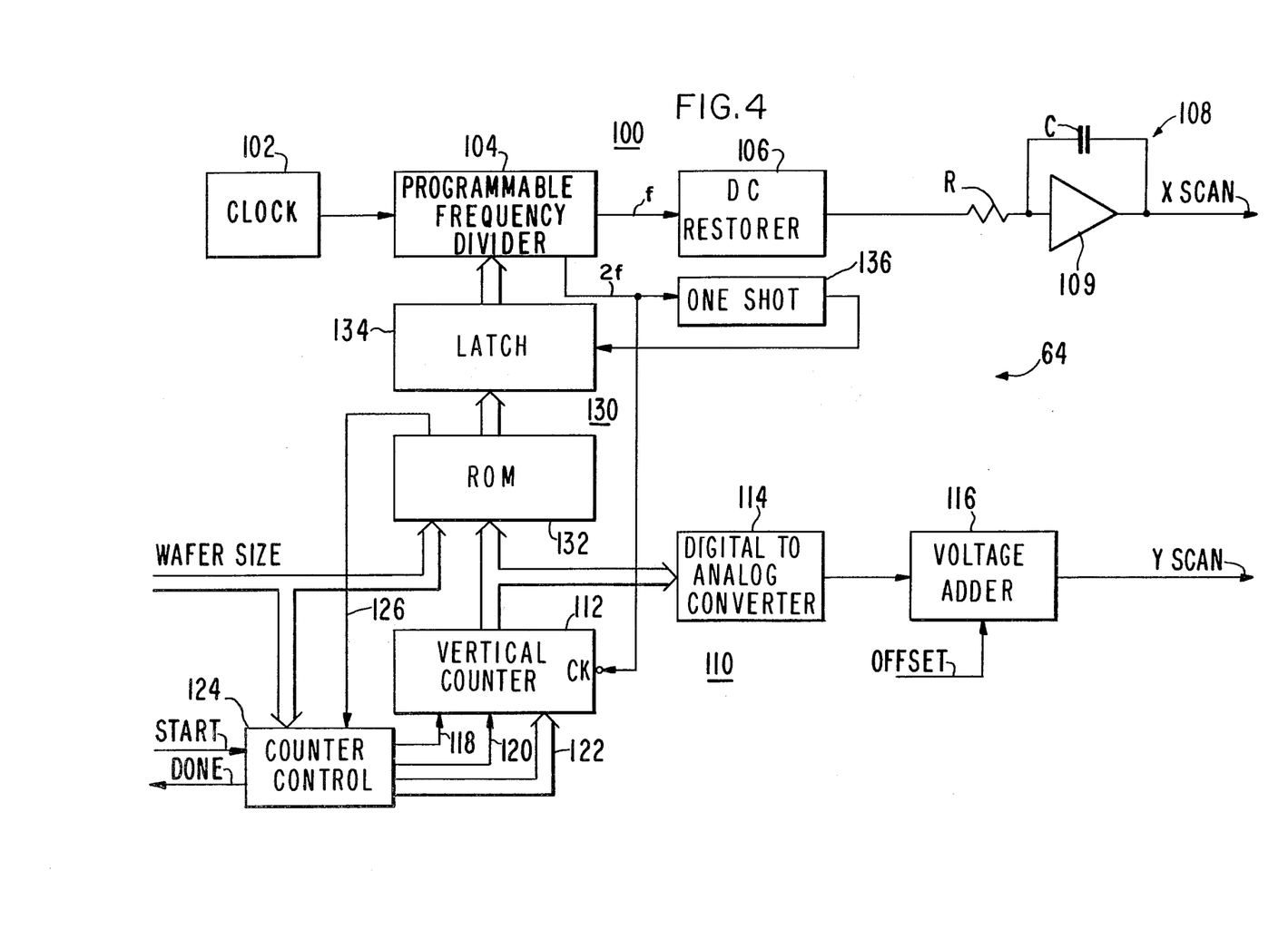
FIG. 4 is a schematic diagram of a scan generator in accordance with the present invention.

The scan generator 64 is shown in the form of a detailed block diagram in FIG. 4. The scan pattern shown in FIG. 3 and described hereinabove is provided by the circuit of FIG. 4 in the form of the scan signals Y SCAN, X SCAN. The scan generator 64 includes X SCAN generator means 100. A clock circuit 102 has an output coupled to a programmable frequency divider 104. The divider 104 has an output frequency f coupled to a DC restorer 106 and also includes an output frequency 2f and control inputs. An integrator 108 is coupled to the output of the DC restorer 106 and provides at its output the scan signal X SCAN. The integrator 108 includes a high gain amplifier 109 with a capacitor C coupled between input and output as a feedback element and a resistor R coupled in series with the input. The scan generator 64 also includes Y SCAN generator means 110. A vertical counter 112 has a clock input coupled to the output frequency 2f of the divider 104 and has outputs coupled to digital inputs of a digital-to-analogconverter 114. A voltage adder 116 is coupled to the analog output of the converter 116 and provides at its output the scan signal Y SCAN. The adder 116 also receives an OFFSET voltage input. The vertical counter 112 receives an up/down control signal 118, a preset enable signal 120 and preset data 122 from a counter control 124. The counter control 124 receives START and WAFER SIZE inputs from an operator control panel or a computer and provides a DONE output. The counter control 124 also receives a reverse signal 126 which indicates that the direction of counting is to be reversed. The scan generator 64 further includes divider control means 130. A read-only-memory (ROM) 132 receives address inputs from the outputs of the vertical counter 112 and from the WAFER SIZE inputs. One of the outputs of the ROM 132 is the reverse signal 126 coupled to the counter control 124. The remaining outputs of the ROM 132 are coupled through a latch 134 to the control inputs of the programmable frequency divider 104. A one-shot 136 has an output coupled to the data transfer input of the latch 134 and an input coupled to the output frequency 2f of the divider 104.

Figure 5:
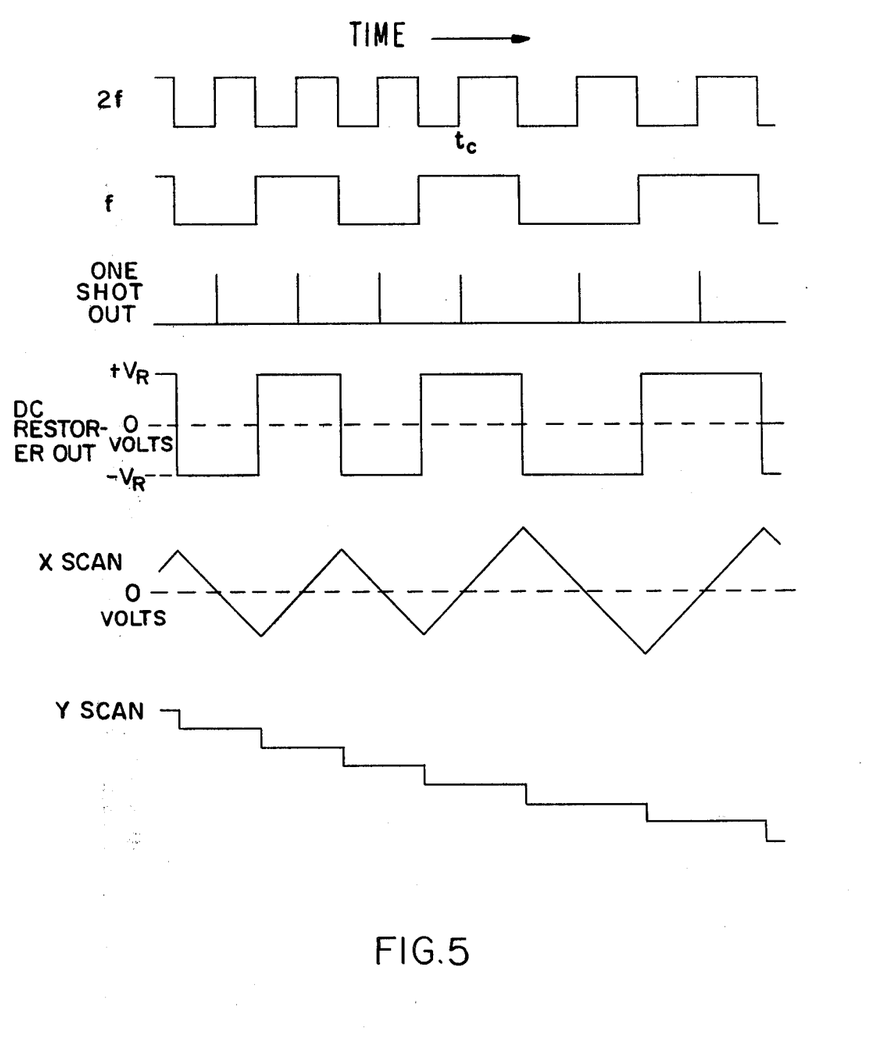
FIG. 5 illustrates voltage waveforms at various points in the scan generator of FIG. 4.

The operation of the scan generator 64 shown in FIG. 4 is described with reference to the voltage waveforms shown in FIG. 5. The voltages are plotted as a function of time with vertically aligned voltage values occurring simultaneously. The clock circuit 102, which is preferably a crystal controlled clock, provides a constant frequency output. The clock frequency is reduced by the programmable frequency divider 104 to provide a square wave output at the frequency f as shown in FIG. 5. The ratio between the clock frequency and the output frequency f depends on the state of the control inputs from the latch 134. Programmable frequency dividers are commercially available as integrated circuits such as type CD4089BM sold by National Semiconductor Corporation. The output frequency f of the divider 104 is typically a logic signal and is converted to a zero-average signal by the DC restorer 106 as shown in FIG. 5. The square wave output of the DC restorer 106 swings between a positive voltage $+V_R$ and a negative voltage $-V_R$ which are equal in magnitude. The DC restorer 104 output magnitude remains constant due to the fixed amplitude output of the divider 104 while the frequency f is variable. DC restorer circuits are generally known in the art.

The square wave output of the DC restorer 106 is converted by the integrator 108 to a series of alternating positive and nagative ramp voltages, commonly known as a triangle wave (see X SCAN in FIG. 5). When the integrator 108 receives a constant input voltage, its output is given by $$X\ SCAN\ (t) = \frac{-V_i t}{RC} \quad (4)$$

where
 $V_i$ = a constant input voltage
 RC = time constant of the integrator
The input to integrator 108 alternates between $+V_R$ and $-V_R$ at the frequency f. Thus, $$X\ SCAN\ (t) = \frac{-V_R t}{RC} \text{ when } V_i = +V_R$$

-continued $$X\ SCAN\ (t) = \frac{+V_R t}{RC} \text{ when } V_i = -V_R$$

The above expressions represent a waveform having alternating positive and negative ramp voltages with slopes, or rates of change, of opposite polarities and, importantly, equal magnitudes $$\left(\frac{V_R}{RC}\right).$$

This insures that the ion beam is always scanned at a constant rate and that the implanted impurity dosage is the same in both scan directions.

The length $L_n$ of each horizontal scan line is determined by the peak-to-peak magnitude of X SCAN and can be expressed as $$L_n = K(X\ SCAN_{p-p}) \tag{5}$$

where
   $K$ = a constant

When X SCAN is a ramp voltage of constant slope, the peak-to-peak magnitude of X SCAN is dependent on the time duration of the ramp. The time duration of each ramp is given by $$t_o = \frac{1}{2}\left(\frac{1}{f}\right) \tag{6}$$

substituting $t_o$ and $V_R$ into equation (4) gives $$X\ SCAN_{p-p} = \frac{V_R}{2fRC} \tag{7}$$

and from equation (5), $$L_n = \frac{KV_R}{2fRC} \tag{8}$$

It is seen that $L_n$ varies inversely with the frequency f. Therefore, the length $L_n$ and the shape of the scan pattern can be controlled by varying the frequency f provided by the programmable frequency divider 104. More particularly, the frequency f can be varied to provide the circular scan pattern shown in FIG. 3. Solving equation (8) for f gives $$f = \frac{KV_R}{2L_n RC} \tag{9}$$

Since the length $L_n$ of each horizontal scan line is known from equation (3), the required frequency f for each scan line can be calculated from equation (9). The short horizontal scan lines at the top and bottom of the circle correspond to relatively high frequencies f while the longer horizontal scan lines at the center of the circle correspond to relatively low frequencies f. Referring again to FIG. 5, the frequency f decreases at time $t_c$ and the peak-to-peak magnitude of X SCAN increases after time $t_c$.

Initially, WAFER SIZE data is supplied to the scan generator 64 so as to determine the dimension of the pattern to be scanned. The counter control 124 converts the WAFER SIZE data to the preset data 122 according to a predetermined conversion which determines the initial state of the vertical counter 112. The vertical counter can be one or more synchronous up/down counter integrated circuits. When the START signal is received by the counter control 124, the preset enable signal 120 causes the preset data 122 to be loaded into the vertical counter 122. This initial count is converted by the digital-to-analog converter 114 to a Y SCAN voltage which positions the ion beam near the edge of the semiconductor wafer (point A in Fig. 3). Suitable digital-to-analog converters are commercially available. Clearly, the initial count is larger for large wafers and smaller for small wafers. The counter control 124 also provides the up/down control signal 118 which initially enables the vertical counter 112 for down counting. The vertical counter 112 is then decremented at the frequency 2f, which is twice the frequency f of the square wave provided to the integrator 108. Since each half cycle of the square wave corresponds to one horizontal scan line, the count in the vertical counter 112 is altered at the end of each horizontal scan line. For example, in FIG. 5 the vertical counter 112 is toggled each time the waveform at frequency 2f goes low, corresponding to the transition points of the X SCAN signal. The altered count in the vertical counter 112 is converted by the converter 114 to an analog voltage which changes in equal increments (see Y SCAN in FIG. 5). Furthermore, the increments in the Y SCAN signal are synchronized in time to occur at the transitions of the X SCAN signal between a positive ramp and a negative ramp. Since the increments in the Y SCAN signal are equal, successive horizontal scan lines always have equal spacing. Thus, uniform implantation of impurities is insured.

When the scanning has progressed to the center of the semiconductor wafer 70, the vertical counter 112 reaches zero count and then proceeds to count negatively. The Y SCAN voltage continues to decrease in equal increments at the end of each horizontal scan line. When the ion beam has scanned the last line at the bottom of the wafer, the reverse signal 126 is received from the ROM 132, as described hereinafter. The counter control 124 causes the up/down control signal 118 to change state. The vertical counter 112 now counts up at the frequency 2f and the Y SCAN signal increases in equal increments. Thus, the scanning of the wafer is repeated but in the reverse direction. When the ion beam has scanned the last line at the top of the wafer, the counter 112 is again reversed and the scanning is repeated in the opposite direction. When a prescribed number of scan patterns has been completed, the counter control 124 provides the DONE signal and the process is halted.

The voltage adder 116 adds the OFFSET voltage to the output of the converter 114 to provide interlacing between scan patterns as described hereinabove. The adder 116 can be a simple summing amplifier. The OFFSET voltage is incremented in equal steps at the completion of each scan pattern, thus causing a shift of the Y SCAN signal.

The frequency f provided by the divider 104 and the corresponding length $L_n$ of the horizontal scan lines are controlled by the information stored in the ROM 132. Each horizontal scan line of the scan pattern has a corresponding data word stored in the ROM 132. For example, when the scan pattern includes 256 horizontal scan lines, 256 data words, which specify the frequency f of the divider 104 for each scan line, are stored in the ROM 132. The ROM 132 is addressed by WAFER SIZE, which is described hereinafter, and the outputs of the vertical counter 112. As the counter 112 advances the ion beam vertically up or down the wafer, as described hereinabove, successive data words in the ROM 132 are addressed and the data words are provided to the divider 104 so as to control the frequency f for each horizontal scan line. The appropriate frequencies to describe a circular scan pattern are determined from equations (3) and (9) above.

Each wafer size to be processed by the system has an associated number of horizontal scan lines. Also, each wafer size has an associated sequence of lengths $L_n$ of horizontal scan lines. By selecting the ROM 132 to have the appropriate capacity, data for all possible wafer sizes can be stored in the ROM 132. For example, data corresponding to a 3 inch wafer can be stored in one region in location 0 through 255, data corresponding to a 4 inch wafer can be stored in another region in locations 256 through 511, and so on. In a preferred embodiment, the ROM 132 stores both circular and square patterns for each wafer size to be processed. The square pattern is used during system set-up and alignment, while the circular pattern is used for normal wafer implantation. The WAFER SIZE input addresses the desired region of the ROM 132 while the vertical counter 112 addresses particular data words within the region. The ROM 132 can be a type 2708 erasable-programmable read only memory containing 2048 8-bit words. The 2708 is sold by National Semiconductor Corporation.

It will be realized by those skilled in the art that the capacity of the ROM 132 can be reduced by permitting several successive horizontal scan lines to have the same length $L_n$. Each group of successive scan lines with the same length $L_n$ is represented by one data word in the ROM 132. Thus, if the scan pattern is scanned with groups of four scan lines having equal length $L_n$, the capacity of the ROM 132 can be reduced by a factor of four. However, some additional undesired overscan occurs.

One bit of each data word in the ROM 132 is reserved for the reverse signal 126. This bit becomes active only after the last scan line at the top or bottom of the wafer has geen completed. The reverse signal 126 indicates that a scan pattern has been completed and that the scan direction is to be reversed.

While the scan generator 64 shown in FIG. 4 has been described in connection with the generation of a circular pattern, scan patterns of arbitrary shape can be generated. The shape of the resultant scan pattern is determined by the data words in the ROM 132 corresponding to the lengths $L_n$ of each horizontal scan line. Thus, square or triangular patterns can be generated by the scan generator 64 by appropriate choice of data words in the ROM 132.

The latch 134 and the one shot 136 are present to insure that the programmable frequency divider 104 changes the frequency f at the center of the horizontal scan line, the point at which the X SCAN signal passes through zero volts. This insures that the output of the integrator 108 remains symmetrical about zero volts and that the scan pattern remains centered on the wafer.

The latch 134 operates to transfer the data at its inputs to its outputs at the time when a pulse is received from the one shot 136. In the present example, the vertical counter 112 changes state on the negative going edge of the frequency 2f, corresponding in time with the end of each scan line. The one shot 136 is configured to trigger on the positive going edge of the frequency 2f (see FIG. 5). Alternatively, the vertical counter 112 can be configured to change state on the positive going edge of the frequency 2f, in which case the one shot 136 is triggered on the negative going edge of the frequency 2f. Since the frequency 2f output of the divider is a square wave, the one shot 136 is triggered as the ion beam passes the center of the wafer. At this time the divider 104 receives new control data from the latch 134 and changes to a new frequency f. FIG. 5 illustrates the change of the frequency f at time $t_c$. Note that the one shot 136 provides a pulse each time the X SCAN signal passes through zero volts.

Thus, there is provided by the present invention a method of and apparatus for scanning an ion beam over a workpiece in a predetermined pattern. The apparatus is particularly suited for scanning a circular pattern corresponding to the size and shape of a semiconductor wafer. The circular pattern reduces overscan time and improves system throughput. Furthermore, the apparatus, by providing a constant scan rate and equal spacing between scan lines regardless of the size of the wafer being scanned, insures that the wafer receives a highly uniform impurity dosage.

While there has been shown and described what is at present considered the preferred embodiments of the invention, it will be obvious to those skilled in the art that various changes and modifications may be made therein without departing from the scope of the invention as defined by the appended claims.

What is claimed is:

1. Apparatus for scanning a charged particle beam over a workpiece, said apparatus comprising:
   first deflection means for deflection of said beam in response to a first scanning voltage;
   second deflection means for deflection of said beam in response to a second scanning voltage, said first and said second deflection means being operative to deflect said beam in mutually perpendicular directions;
   first generating means coupled to said first deflection means for generating said first scanning voltage which includes alternating positive ramp portions and negative ramp portions and transitions therebetween, said positive and negative ramp portions being controllable in time duration;
   second generating means coupled to said second deflection means for generating said second scanning voltage which remains constant during said positive and negative ramp portions and which is incremented at the time of said transitions between ramp portions;
   control means for controlling the time durations of said positive and negative ramp portions according to a series of predetermined time durations so as to provide a scan pattern corresponding in size and shape to the size and shape of said workpiece.

2. Apparatus for scanning a charged particle beam as defined in claim 1 wherein said second generating means includes means for incrementing said second scanning voltage in equal imcrements at the time of said transitions.

3. Apparatus for scanning a charged particle beam as defined in claim 2 wherein said alternating positive and negative ramp portions have constant rates of change and have rates of change of equal magnitude.

4. Apparatus for scanning a charged particle beam as defined in claim 3 wherein said first generating means includes integrator means for converting a square wave voltage of constant amplitude to said alternating positive and negative ramp portions, said square wave voltage being controllable in frequency.

5. Apparatus for scanning a charged particle beam as defined in claim 4 wherein said first generating means further includes frequency source means for generating said square wave voltage.

6. Apparatus for scanning a charged particle beam as defined in claim 5 wherein said frequency source means includes programmable frequency divider means for controlling the frequency of said square wave voltage in response to control data provided by said control means.

7. Apparatus for scanning a charged particle beam as defined in claim 6 wherein said control means includes storage means for storage of said control data.

8. Apparatus for scanning a charged particle beam as defined in claim 7 wherein said storage means stores control data corresponding to a generally circular scan pattern.

9. Apparatus for scanning a charged particle beam as defined in claim 7 wherein said storage means stores control data corresponding to a plurality of different scan patterns.

10. Apparatus for scanning an ion beam over a workpiece in an ion implantation system, said apparatus comprising:
first deflection means operative to deflect said beam in response to a first scanning voltage;
second deflection means operative to deflect said beam in response to a second scanning voltage, said first and second deflection means being operative to deflect said beam in mutually perpendicular directions;
frequency source means operative to generate a square wave voltage of controllable frequency;
integrator means operative to convert said square wave voltage to said first scanning voltage including alternating positive ramp portions and negative ramp portions each of which causes said beam to scan said workpiece in a time duration corresponding to the frequency of said square wave voltage;
counter means operative to store a number which determines the deflection of said beam by said second deflection means, said number remaining constant during said ramp portions and being altered at the completion of each ramp portion;
digital-to-analog converter means operative to convert the number stored in said counter means to said second scanning voltage; and
storage means addressed by said counter means and operative to control the frequency of said frequency source means according to a predetermined sequence so as to provide a scan pattern corresponding in size and shape to the size and shape of said workpiece.

11. Apparatus for scanning an ion beam as defined in claim 10 wherein said frequency source means generates a square wave voltage of constant amplitude whereby said ramp portions have constant rates of change and have rates of change of equal magnitude.

12. Apparatus for scanning an ion beam as defined in claim 11 wherein said counter means is altered by one count at the completion of each ramp portion whereby said second scanning voltage is altered in equal increments.

13. Apparatus for scanning an ion beam as defined in claim 12 wherein said storage means controls the frequency of said frequency source means so as to provide a generally circular scan pattern.

14. Apparatus for scanning an ion beam as defined in claim 13 wherein said frequency source means includes programmable frequency divider means for controlling the frequency of said square wave voltage in response to control data provided by said storage means.

15. Apparatus for scanning an ion beam as defined in claim 14 further including timing means operative to transfer said control data from said storage means to said programmable frequency divider means at the zero crossings of said first scanning voltage.

16. Apparatus for scanning an ion beam as defined in claim 14 wherein said storage means stores control data corresponding to a plurality of different scan patterns.

17. In a charged particle beam irradiation system of the type including first deflection means and second deflection means operative to deflect said beam in mutually perpendicular directions in response to voltages applied thereto, a method of scanning the charged particle beam over a workpiece, said method comprising the steps of:
generating a first scanning voltage which includes alternating positive ramp portions and negative ramp portions and transitions therebetween, said positive and negative ramp portions being controllable in time duration;
applying said first scanning voltage to said first deflection means;
generating a second scanning voltage which remains constant during said positive and negative ramp portions and which is incremented at each of said transitions between ramp portions;
applying said second scanning voltage to said second deflection means; and
controlling the time durations of said positive and negative ramp portions according to a predetermined sequence so as to provide a scan pattern corresponding in size and shape to the size and shape of said workpiece.

18. The method of scanning a charged particle beam as defined in claim 17 wherein said first scanning voltage is generated with said ramp portions having constant rates of change and having rates of change of equal magnitude.

19. The method fo scanning a charged particle beam as defined in claim 18 wherein second scanning voltage is incremented in equal steps at each of said transitions between ramp portions.

* * * * *